United States Patent [19]

Su et al.

[11] Patent Number: 5,696,036
[45] Date of Patent: Dec. 9, 1997

[54] DRAM NO CAPACITOR DIELECTRIC PROCESS

[75] Inventors: Wen-Doe Su; Jen-Di Wen, both of Hsinchu; Ming-Huang Wu, Kaoshiung, all of Taiwan

[73] Assignee: Mosel, Vitelic Inc., Hsinchu, Taiwan

[21] Appl. No.: 751,089

[22] Filed: Nov. 15, 1996

[51] Int. Cl.$^6$ .................... H01L 21/265; H01L 21/102
[52] U.S. Cl. .................... 438/239; 438/247; 438/253; 438/724; 438/738
[58] Field of Search .................... 437/52, 241, 242

[56] References Cited

U.S. PATENT DOCUMENTS

| | | |
|---|---|---|
| 4,575,921 | 3/1986 | Bhagat .................... 437/241 |
| 4,990,463 | 2/1991 | Mori .................... 437/52 |
| 5,073,510 | 12/1991 | Kwon et al. .................... 437/44 |
| 5,296,399 | 3/1994 | Park .................... 437/52 |
| 5,324,681 | 6/1994 | Lowrey et al. .................... 437/52 |
| 5,468,302 | 11/1995 | Thietje .................... 134/2 |
| 5,518,946 | 5/1996 | Kuroda .................... 437/241 |
| 5,563,088 | 10/1996 | Tseng .................... 437/52 |

OTHER PUBLICATIONS

Ghandhi, Sorab K. "VLSI Fabrication Principles Silicon and Gallium Arsenide," John Wiley & Sons, Inc. pp. 639–642, 1994.

Primary Examiner—John Niebling
Assistant Examiner—Michael S. Lebentritt
Attorney, Agent, or Firm—Bacon & Thomas

[57] ABSTRACT

A new method of fabricating the NO capacitor dielectric layers of dynamic random access memory (DRAM) cells is disclosed. Because $NH_4Cl$ particles are soluble (dissolvable) in deionized (DI) water, the undesired $NH_4Cl$ particles left in the thin nitride surface of the DRAM capacitor dielectric layer can be removed by high-speed spinning the silicon wafers while spraying DI water. At the same time, this high-speed spinning step produces a charge-up effect that can also help the thin nitride layer of the DRAM capacitors eliminate these defects. High quality capacitors are then achieved, and therefore high quality DRAM cells may also be produced using this method.

10 Claims, 4 Drawing Sheets

DRAM NO CAPACITOR DIELECTRIC PROCESS

BACKGROUND OF THE INVENTION

1. Field of the Invention

The present invention relates to a method of fabricating the capacitors in dynamic random access memory (DRAM) cells, especially for the capacitor dielectric layers of the Stack DRAMs.

2. Description of the Prior Art

A DRAM cell comprises Metal-Oxide-Semiconductor Field Effect Transistors (MOSFETs) and capacitors. A MOSFET usually includes a Gate Oxide, Gate, Source and Drain Electrodes, while a capacitor consists of a top electrode plate, capacitor dielectric and storage node. The top electrode plate and storage node of a capacitor are typically made of polysilicon. There is an electrical contact between the source of a MOSFET and the storage node of the adjacent capacitor, forming a memory cell of the DRAM device. A large number of memory cells make up the cell arrays which combine with the peripheral circuit to produce Stack DRAMs.

In recent years, the sizes of MOSFETs and capacitors have become continuously smaller so that the densities of these DRAM devices have increased considerably. For example, a number of semiconductor manufacturing companies in the world have already begun mass production of 16M bit DRAMs. In order to maintain or even increase the values of the capacitance for smaller size capacitors, increasing the surface area of the polysilicon storage nodes or reducing the thickness of the dielectric layer is necessary.

A number of issued patents have addressed this issue. U.S. Pat. No. 5,006,481 to Chan et al. (the entire disclosure of which is herein incorporated by reference) provides a method of making a thin ONO stacked capacitor DRAM cell. Another U.S. Pat. No. 5,204,280 to Dhong et at. (the entire disclosure of which is herein incorporated by reference) describes a method to fabricate multiple pillars inside a DRAM trench for increased capacitor surface area.

Current technology for the fabrication of the high density DRAM devices in the VLSI industry uses Nitride and Oxide (NO) double layers to form the capacitor dielectric. In the conventional method, the silicon wafer is first placed inside the fast temperature process system (FTPS), a thin layer of Nitride (N) is grown on the surface of polysilicon storage node in an $NH_3$ flow environment, then a new Oxide layer (O) is grown on top of the nitride layer in the temperature range of 800° C. to 950° C. The growth of the NO capacitor dielectric layer is then completed.

Although 64M bit Stack DRAM chips can be mass produced using these thin NO capacitor dielectric structures which are formed by the fast temperature process system (FTPS), the disadvantage of this process is that a large number of $NH_4Cl$ particles are formed in this process which will contaminate the NO capacitor dielectric and this lowers the yield of the DRAM production. At the same time, the contaminated FTPS furnace requires more maintenance which greatly increases the production cost.

Accordingly, how to form a high quality NO capacitor dielectric layer without $NH_4Cl$ particle contamination is a top priority for the booming high-density DRAM VLSI industry.

SUMMARY OF THE INVENTION

A principle object of the present invention is to provide a new effective manufacturing method for fabricating the capacitor dielectric layers of Stack DRAM devices.

In accordance with the object of this invention, a new processing procedure has been developed. First, a thin layer of field oxide for isolation is grown on the surface of the silicon semiconductor wafer using the standard technology of the semiconductor industry. Then, MOSFET is formed by conventional technology as shown in FIG. 1.

For the capacitor regions, the storage nodes are made of polysilicon by conventional lithography and plasma-etching techniques. Then, a thin layer of nitride is grown on top of storage nodes in an FTPS furnace using $NH_3$ flow. This is followed by a high-speed silicon wafer spinning step while spraying DI (deionised water) on the layer to remove the $NH_4Cl$ particles on the nitride surface. At the same time, the charge up phenomenon which occurs on the nitride layer in this spinning step also helps the nitride layer recover from the $NH_4Cl$ defects.

Another layer of oxide is grown by the high temperature FTPS furnace to complete the NO capacitor dielectric growth. Finally, top electrodes made of polysilicon are fabricated by conventional lithography and plasma-etching techniques. A high quality capacitor forming process is accomplished by the present invention.

BRIEF DESCRIPTION OF THE DRAWINGS

The accompanying drawings forming a material part of this description.

DESCRIPTION OF THE PREFERRED EMBODIMENTS

The invention disclosed herein is directed to a method of fabricating the capacitor dielectric of MOS devices. In the following description, numerous details are set forth in order to provide a thorough understanding of the present invention. It will be appreciated by one skilled in the art that variations of these specific details are possible while still achieving the results of the present invention. In other instances, well-known processing steps are not described in detail in order to not unnecessarily obscure the present invention.

Figure 1:
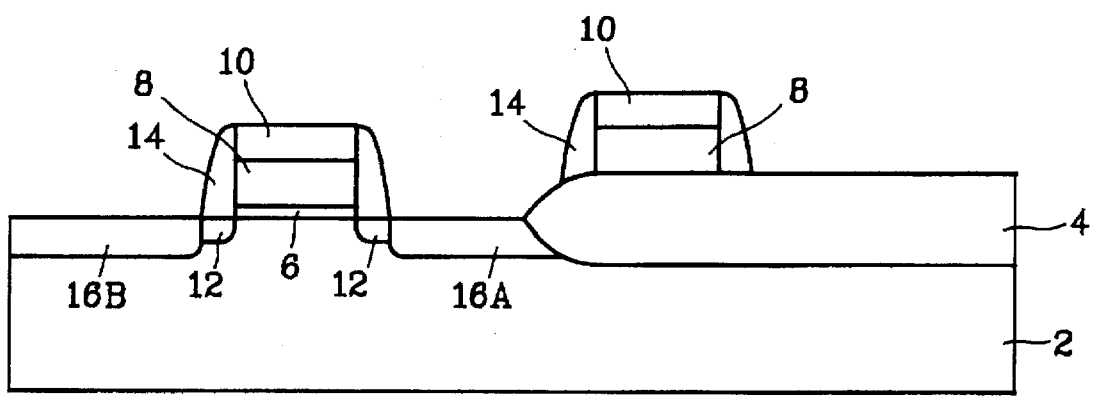
FIG. 1 is a cross sectional representation of an integrated circuit after the MOSFET is finished.

Referring now more particularly to FIG. 1, there is shown a portion of a practically completed integrated circuit after the MOSFET is finished. The silicon semiconductor wafer 2 is preferably composed of monocrystalline silicon. Field oxide regions 4 have been formed in the semiconducting wafer 2 for isolation. The thickness of the field oxide layer is about 3500 to 6000 Angstroms. MOSFET regions comprise a Gate Oxide 6, Gate 8, Pad Oxide 10, lightly doped region 12, Spacer 14, Source 16A and Drain 16B.

Figure 2:
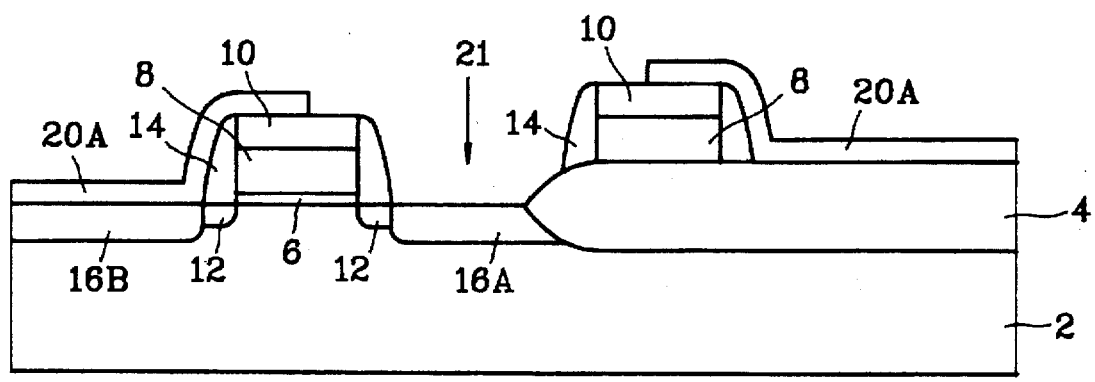
FIG. 2 is a cross sectional representation of the circuit of FIG. 1 after formation of the first dielectric layer.

Referring now to FIG. 2, a first dielectric ($SiO_2$) layer 20 (not shown) is deposited over the surface of the oxide layer, this is followed by conventional lithography and plasma-etching processes to pattern a node contact window 21 and first dielectric layer 20A. The first dielectric layer 20 etching process can use magnetic enhanced reactive ion etching (MERIE), electron cyclotron etching (ECR) or conventional reactive ion etching (RIE) methods to form layer 20 (A). For example, most factories in Taiwan manufacturing semiconductors use MERIE techniques to etch the first dielectric layer 20 (not shown). The plasma etching technique can utilize a plasma etcher such as a Lam Research Inc. Model Rainbow 4520 with reactant fluorinated gases such as tetrafluoromethane ($CF_4$) and trifluoromethane ($CHF_3$).

Figure 3:
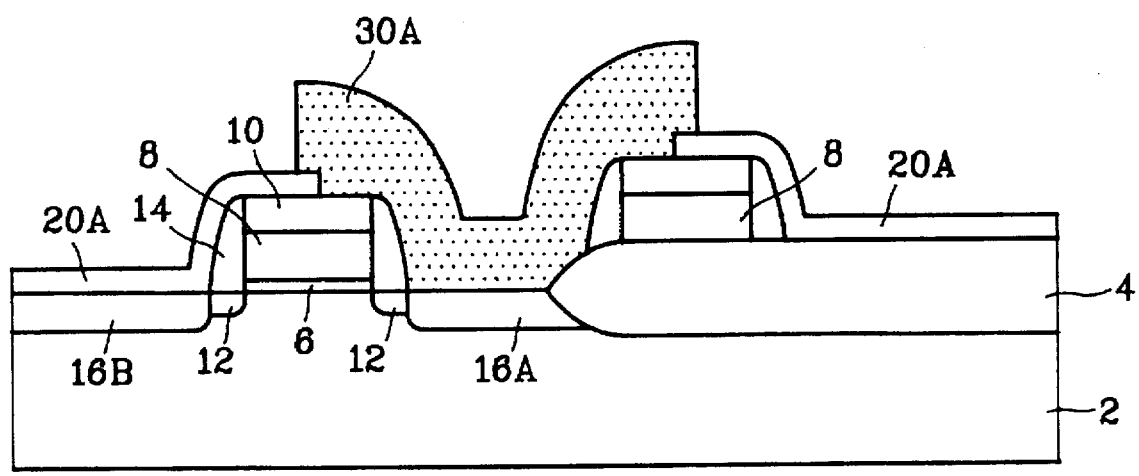
FIG. 3 is a cross sectional representation of the circuit of FIG. 2 after formation of the capacitor storage node.

Referring now to FIG. 3, after forming the first polysilicon layer 30 (not shown), the capacitor storage node 30A is patterned by standard lithography and plasma-etching techniques. The capacitor storage node 30A has an electrical contact with the source of the MOSFET 16A in the contact window region. The first polysilicon layer 30 may be etched by a plasma etcher such as a Lam Research Inc. Model Rainbow 4520. The first polysilicon layer 30 etching conditions are as follows: It has a pressure of about 20 mTorr, a power of about 300 Watts, with reactant gases $SF_6$ flow rates of 20 to 40 SCCM and HBr of 10 to 20 SCCM.

Figure 4:
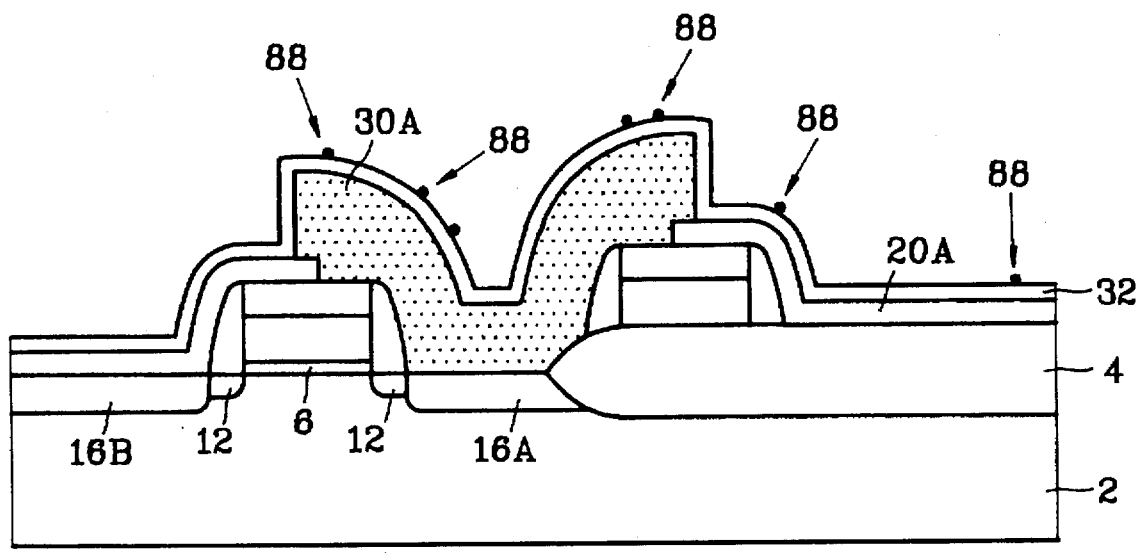
FIG. 4 is a cross sectional representation of the circuit of FIG. 3 after a thin silicon nitride layer is grown on the surface of the capacitor storage node.

Referring now to FIG. 4, a thin nitride ($Si_3N_4$) layer 32, which has a thickness of 40 to 60 Angstroms, is grown on the whole top area by a FTPS furnace using dichlorosilane ($SiH_2Cl_2$) and ammonia ($NH_3$) gases during which a large number of $NH_4Cl$ particles have also been produced as shown in FIG. 4.

Figure 5:
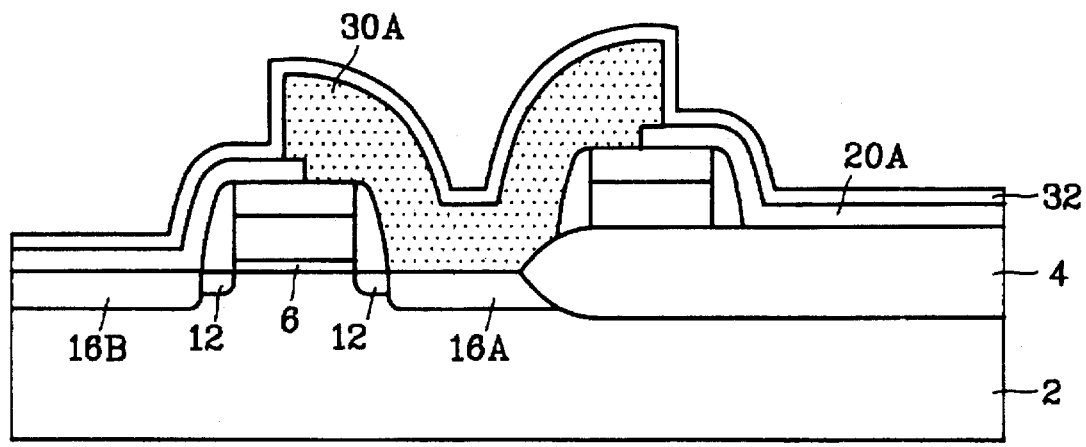
FIG. 5 is a cross sectional representation of the circuit of FIG. 4 after removal of $NH_4Cl$ particles by spinning and spraying with deionized water.

Referring now to FIG. 5, the silicon semiconductor wafer 2 is placed in a high-speed spinner while spraying DI (deionised) water. Because the $NH_4Cl$ molecules are soluble or dissolvable in water, the $NH_4Cl$ particles 88 are removed from the surface of the nitride layer 32 in this high-speed spinning step as shown in FIG. 5. On the other hand, the high-speed spinning silicon wafer 2 in DI water also produces a charging effect in the surface of nitride layer 32 which promotes removal of the $NH_4Cl$ defects. Therefore, a high quality nitride layer 32 is obtained. The machine used was a DNS-scrubber, a spin speed of 6000 RPM, with spray injection of the deionized water for a period of 40 seconds at a flow rate of 450 Sccm. The distance between the nozzle and wafer is 7 cm.

Figure 6:
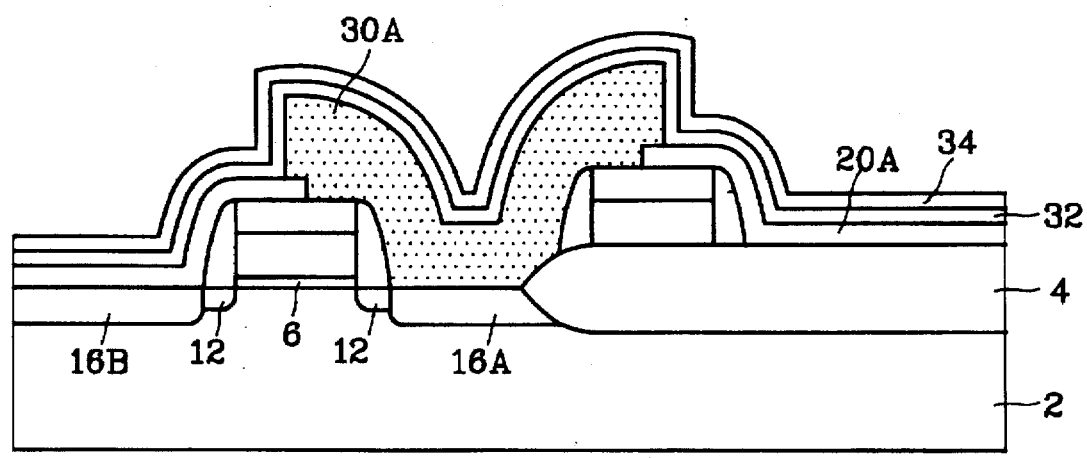
FIG. 6 is a cross sectional representation of the circuit of FIG. 5 after an oxide layer is grown on the surface of the nitride layer.

Referring now to FIG. 6, the structure of FIG. 5 is subjected to a thermal oxidation step in which an oxide layer 34 is grown on the surface of the nitride layer 32. The oxidation occurs at a temperature of about 850° to 950° C., with oxygen flowing to create an oxide layer of about 40 to 200 Angstroms thick. The desired contamination free NO capacitor dielectric structure is produced as shown in FIG. 6.

Figure 7:
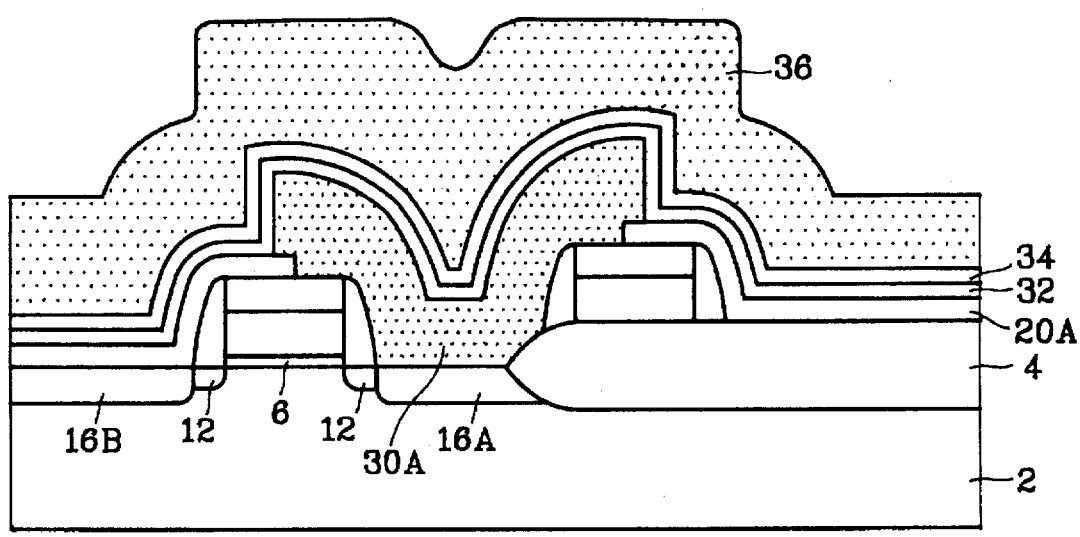
FIG. 7 is a cross sectional representation of the circuit of FIG. 6 after formation of a second polysilicon layer.

Referring now to FIG. 7, a second polysilicon layer 36 is formed over the surface of the NO capacitor dielectric layer as top electrode.

Figure 8:
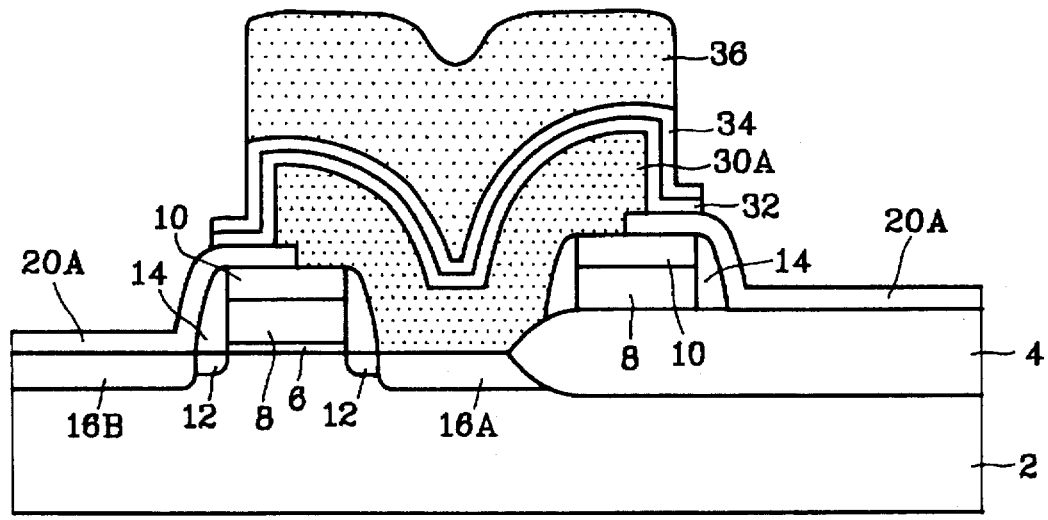
FIG. 8 is a cross sectional representation of the final capacitor structure.

Referring now to FIG. 8, this is the final capacitor structure of this process. The second polysilicon layer 36 and NO capacitor dielectric 32/34 are patterned by standard lithography and plasma-etch techniques. A new process for high quality DRAM capacitor has been described.

We claim:

1. A method for forming a capacitor dielectric layer for an integrated circuit device which comprises:
   (a) forming a first polysilicon layer on semiconductor wafer;
   (b) forming a silicon nitride layer overlying said first polysilicon layer;
   (c) high-speed spinning said semiconductor wafer while spraying DI water on the surface of said silicon nitfide layer to reduce $NH_4Cl$ defects formed during the nitriding step;
   (d) forming an oxide layer overlying said silicon nitride layer.

2. A method according to claim 1, wherein the high speed spinning is at a rate of 4500 to 6500 rpm.

3. A method according to claim 2, wherein the spraying takes place for 30 to 50 seconds.

4. A method of forming a stack capacitor for a DRAM cell which comprises:
   (a) providing a semiconductor wafer having a top surface;
   (b) forming a field oxide layer for MOSFET isolations overlying said top surface;
   (c) forming a MOSFET structure wherein said MOSFET consists of gate oxide, gate, source and drain;
   (d) forming a first polysilicon layer as storage nodes of the capacitor overlying said source of the MOSFET structure;
   (e) forming a silicon nitfide layer overlying said first polysilicon layer;
   (f) high-speed spinning said semiconductor wafer while spraying DI water on the surface of said silicon nitfide layer to reduce $NH_4Cl$ defects formed during the nitriding step;
   (g) forming an oxide layer overlying said silicon nitride layer to complete a NO capacitor dielectric layer;
   (h) forming a second polysilicon layer as top electrodes of the capacitor overlying said oxide layer;
   (i) partially etching said second polysilicon, oxide, and silicon nitride layers by lithography and plasma-etch techniques.

5. A method according to claim 4, wherein the high speed spinning is at a rate of about 6000 rpm.

6. A method according to claim 5, wherein the spraying takes place for about 40 seconds.

7. A method according to claim 1, wherein the high speed spinning is at a rate of about 6000 rpm.

8. A method according to claim 2, wherein the spraying takes place for about 40 seconds.

9. A method according to claim 4, wherein the high speed spinning is at a rate of about 4500–6500 rpm.

10. A method according to claim 9, wherein the high speed spinning is at a rate of 30–50 seconds.

* * * * *